United States Patent [19]

Bartilson

[11] Patent Number: 6,055,157
[45] Date of Patent: Apr. 25, 2000

[54] LARGE AREA, MULTI-DEVICE HEAT PIPE FOR STACKED MCM-BASED SYSTEMS

[75] Inventor: Bradley W. Bartilson, Houston, Tex.

[73] Assignee: Cray Research, Inc., Eagan, Minn.

[21] Appl. No.: 09/056,037

[22] Filed: Apr. 6, 1998

[51] Int. Cl.[7] .................................................. H05K 7/20
[52] U.S. Cl. ...................... 361/699; 361/700; 361/704; 361/707; 361/719; 361/720; 174/15.1; 174/15.2; 165/80.4
[58] Field of Search .................................... 361/689, 696, 361/687, 699, 700, 701, 703–705, 707, 717–719; 165/80.3, 80.4, 104.33, 185, 104.19; 174/15.2

[56] References Cited

U.S. PATENT DOCUMENTS

| | | | |
|---|---|---|---|
| 5,083,194 | 1/1992 | Bartilson | 357/81 |
| 5,166,775 | 11/1992 | Bartilson | 361/383 |
| 5,181,167 | 1/1993 | Davidson et al. | 361/699 |
| 5,230,564 | 7/1993 | Bartilson et al. | 374/178 |

(List continued on next page.)

FOREIGN PATENT DOCUMENTS 5315781  11/1993  Japan ..................................... 361/700

OTHER PUBLICATIONS

Chao, S.J., "Thermal Management of High Power Tab IC Chips Incorporating Heat Spreaders and Heat Pipes", Proceedings of the 9th International Heat Transfer Conference, pp. 295–300, (Aug. 1990).

Kishimoto, T., et al., "Heat Pipe Cooling Technology for High Speed ATM Switching MCMs", International Conference and Exhibition Multichip Modules, pp. 142–150, (1994).

Lin, W., et al., "Reliability and Thermal Characterizing of a 3–Dimensional Multichip Module", 1993 Proceedings: 43rd Electronic Components & Technology Conference, pp. 71–79, (Jun. 1–4, 1993).

Peterson, D., et al., "Demonstration of a High Heat Removal Diamond Substrate Edge–Cooled Multichip Module", Proceeding of the 1994 International Conference on Multichip Module, Proceeding of the 1994 Conference on Multichip Modules, 624–30, (Apr. 15, 1994).

*Primary Examiner*—Leo P. Picard
*Assistant Examiner*—Boris L. Chervinsky
*Attorney, Agent, or Firm*—Schwegman, Lundberg, Woessner & Kluth, P.A.

[57] ABSTRACT

The invention is a computer module for scalably adding computing power and cooling capacity to a computer system. Computing power can be added by merely adding additional printed circuit cards to the computing module. Cooling capability is added by adding heat pipes to the computer module. The computing module for a computer includes a first heat pipe assembly. The first heat pipe assembly has an evaporator plate with an evaporator surface. The first heat pipe also has a condenser in fluid communication with the evaporator plate. The evaporator plate is positioned adjacent one side of a printed circuit board populated with at least one electronic component. The computing module may use a printed circuit board which has two sides populated with electronic components. When a printed circuit board having components on two sides is used, a second heat pipe having the same construction, namely an evaporator plate with an evaporator surface and a condenser in fluid communication with said evaporator plate, is positioned adjacent the other side of said printed circuit board so that the electronic components on the other side are positioned adjacent said evaporator surface of said second heat pipe. The evaporator plate of each heat pipe is connected to the condenser by a plurality of necked-down regions. This forms at least one window between the condenser and the evaporator plate of each heat pipe. When more than one heat pipe is used in the computing module, the windows of the various heat pipes align. Electrical connector components can be routed through the windows. The connector component connects the edge of the printed circuit board positioned near the windows. Additional building blocks, comprising one additional heat pipe and one additional populated printed circuit card can be added to further scale up or upgrade a computer system.

22 Claims, 5 Drawing Sheets

U.S. PATENT DOCUMENTS

| | | | |
|---|---|---|---|
| 5,331,510 | 7/1994 | Ouchi et al. | 361/702 |
| 5,353,192 | 10/1994 | Nordin | 361/700 |
| 5,409,055 | 4/1995 | Tanaka et al. | 361/700 |
| 5,708,297 | 1/1998 | Clayton | 361/720 |
| 5,712,762 | 1/1998 | Webb | 361/687 |
| 5,720,338 | 2/1998 | Larson et al. | 361/700 |
| 5,844,777 | 12/1998 | Gates | 361/700 |

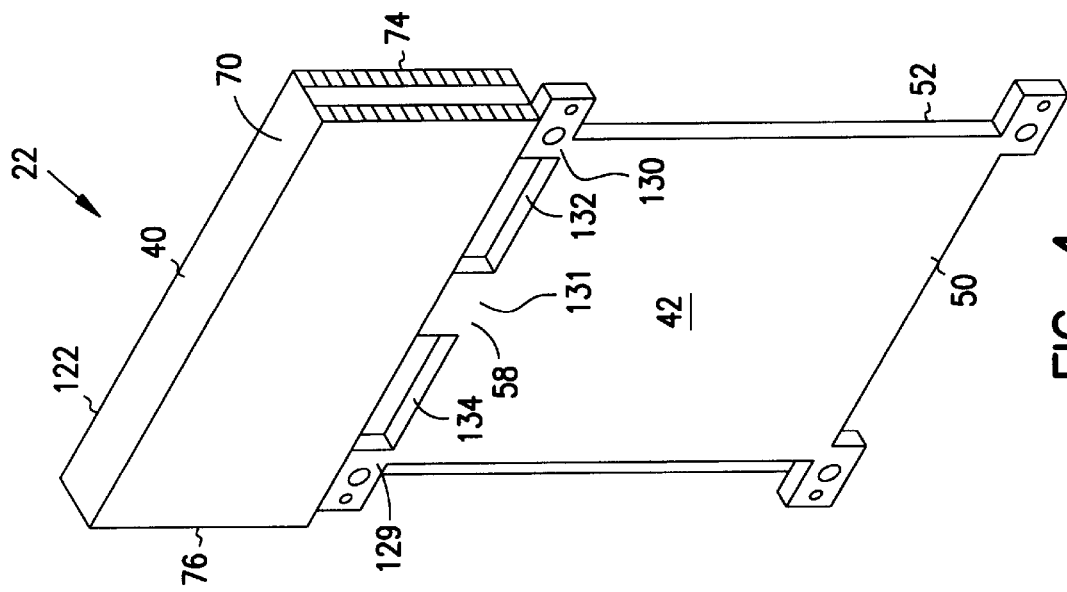
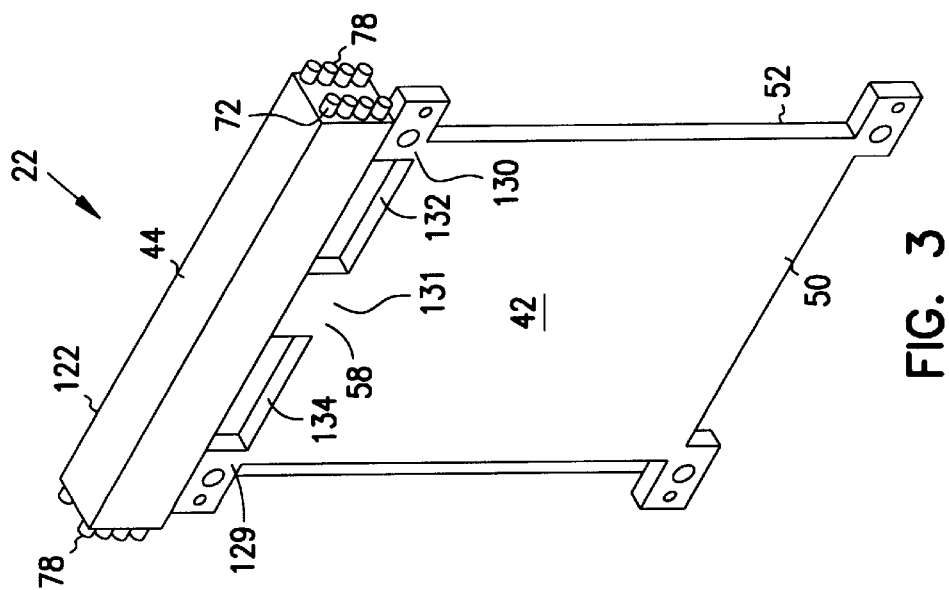

LARGE AREA, MULTI-DEVICE HEAT PIPE FOR STACKED MCM-BASED SYSTEMS

FIELD OF THE INVENTION

The present invention relates to computer electronic package thermal management systems, and more specifically to an apparatus and a method which is a scalable and expandable computer electronic package which adequately dissipates waste heat generated by the electronic components within the package.

BACKGROUND OF THE INVENTION

Computers in platforms ranging from individual workstations to supercomputers generally use densely packaged or stacked electronic modules to enable higher operating speeds through reduced signal latency. These modules perform the various computational and control functions. There are many types of modules such as processor element modules, power modules, control modules, clock modules, daughter card modules, and others, all of which include numerous forms, types and sizes of integrated circuits and electronic components. Most of these modules are more densely packaged, process information faster, and produce more waste heat than their predecessors. The tight packaging leaves less room for providing paths to dissipate the increased waste heat.

Proper cooling is essential in today's computers; excess heat can build up, causing malfunction and failure of integrated circuits and other electrical components. The importance of effective and efficient cooling for each application grows as circuit board assemblies and modules become smaller and more densely packed with ever faster and smaller components. Hence the need for an improved method and apparatus to dissipate the heat.

One way of cooling such components includes incorporating one or more cooling or cold plates within the module. A typical cold plate may either be liquid cooled or air cooled depending on the cooling system and necessary cooling capacity required for the computer into which the plates are installed. The cold plate typically is custom designed to meet the needs of a particular application. A typical cold plate is mounted adjacent heat-producing objects and either directly or indirectly connected via a thermally conductive path to the objects. The cold plate usually has one or more paths or flow channels for air or a liquid coolant to flow through the plate and carry away heat transferred from the objects to the plate. Cold plates may further communicate with a larger cooling system external from the computer or may simply dissipate the heat to the atmosphere.

Another means used for managing waste heat is the use of relatively large discrete heat sinks strategically placed on a printed circuit board adjacent or on top of high power electronic components. A typical heat sink is produced from a material such as aluminum and may include projecting fins or pins for added surface area. The heat sink is in thermal conductive contact with the heat-producing device and absorbs the heat for dissipation to the atmosphere or to a remote reservoir. The size of a discrete heat sink depends on the amount of heat generated by the device. Discrete heat sinks add to the pitch or height of PCB's causing increased electrical signal paths. Discrete heat sinks also require paying attention to component placement on the PCB causing thermal shadowing by blocking air flow over the PCB. Component placement limitations in turn affect electrical design versatility and the capability of the design to accept product upgrades and enhancements.

Another type of liquid cooling system is an immersion system wherein the heat-producing components are submerged in a liquid coolant. This type of system has excellent cooling capacity but is difficult and expensive to maintain. An immersion system is often limited in its application (primarily due to cost and weight) and is particularly unsuitable for workstation systems. Immersion cooling is often unacceptable as all components' materials must be compatible with the dielectric fluid.

Direct transfer to air cooling systems have the advantages of using no hidden secondary cooling/transfer system and have low energy cost limited typically to only a fan of some type to produce a constant air flow across the computer. However, direct air-cooled systems have limited cooling capacity. Liquid-cooled systems have the advantage of providing a high heat capacity resulting in excellent cooling characteristics. A disadvantage of liquid cooling systems is that a remote support system for the coolant is typically required and must be accommodated in the overall computer packaging scheme. Commonly, heat transfer systems require rotating equipment (i.e., fan or pump) to move heat through a distance. The heat pipe system is "self-pumping" in that heat is driven to the condenser section by vapor pressure and returned liquid is brought back to the evaporator by capillary force. Other disadvantages are that liquid cooled systems are expensive to acquire, install, run and maintain and have not achieved acceptability in size. A further disadvantage is that they produce thermal gradients along the coolant flow path resulting in varying component temperatures which in turn results in poor and inconsistent component performance.

Another cooling method which is presently employed utilizes intricate mechanical spreading systems. This type of system is only suitable for high-end computer systems because of high manufacturing costs, complexity, high volume and energy consumption and limited small scale thermal capabilities. Material advances have provided wafer substrate materials and thermal interfaces which efficiently spread or transfer heat to a desired region of a spreading system but the costs involved are excessive when considering the workstation environment.

Commonly available air-cooled heat sinks dissipate heat via a conduction path to an extended surface area. The fin area is limited in size due to conduction loss and associated decreases in efficiency as the distance from the base area increases. The heat pipe thermal management system presented permits almost unlimited growth in this transfer area as it expands the base area of the condenser region (and avoids increasing board-board pitch).

In today's competitive market, the computer industry is driven to reduce the size and increase the speed of computers and components, reduce the number of parts and part variations, reduce manufacturing and assembly complexity, and reduce manufacturing, assembly and part costs. One way the industry has used to achieve these goals is to attempt to produce standardized, interchangeable components and modular assemblies to eliminate the prior practice of using custom-designed components. Single-chip packages are being replaced by multi-chip packages which result in higher-powered, smaller, faster and hotter electronic components.

SUMMARY OF THE INVENTION

The invention is for an apparatus and method of providing a scalable and expandable electronic packaging system which has excellent cooling characteristics and yet is adaptable for use with single-chip and multi-chip technologies and may be incorporated into a modular package. The electronic packaging of the invention provides high cooling capacity within a self-contained unit and does not require a remote cooling support system. The apparatus and method of the invention also requires little or no energy to provide the cooling effect aside from the waste generated by the components.

The invention is a computing module for a computer that includes a large area, first heat pipe assembly. The first heat pipe assembly has an evaporator plate with an evaporator surface. The first heat pipe also has a condenser in fluid communication with the evaporator plate. The evaporator plate is positioned adjacent one side of a printed circuit board populated with at least one electronic component. The computing module may use a printed circuit board which has two sides populated with electronic components. When a printed circuit board having components on two sides is used, a second heat pipe having the same construction, namely, an evaporator plate with an evaporator surface and a condenser in fluid communication with said evaporator plate, is positioned adjacent the other side of said printed circuit board so that the electronic components on the other side are positioned adjacent said evaporator surface of said second heat pipe.

Common cooling techniques availed to a stacked system require access to two full edges of the stack, thus permitting access to only the remaining two for transferring power and interconnecting contacts. The heat pipe system presented avails three complete edges and the gross portion of the fourth edge for non-thermal system usage.

The evaporator plate of each heat pipe is connected to the condenser by a plurality of necked down regions. This forms at least one window between the condenser and the evaporator plate of each heat pipe. When more than one heat pipe is used in the computing module, the windows of the various heat pipes align. In a system consisting of a stack of heat pipes, printed circuit boards and components, the "windows" serve as openings for power bussing or other system interconnect devices to service the stack. The connector component connects the edge of the printed circuit board positioned near the windows.

The computing module provides for scalability since additional computing power can be added by merely adding additional printed circuit cards to the computing module. When an additional printed circuit is added, additional heat pipes are added to scale up the cooling portion of the computing module as well. For example, in a computing module with a double-sided printed circuit card, a first heat pipe is on one side of the printed circuit card and a second heat pipe is positioned on the other side of the printed circuit card. Adding a second circuit board to the computing module is accomplished by positioning said second circuit board adjacent one of the evaporative surfaces of the first or second heat pipes. A third heat pipe assembly is then added to the computer module by positioning the third heat pipe adjacent said second circuit board. Additional sets of one heat pipe and a printed circuit card can be used to upgrade or scale up a computing module. A set of one printed circuit card and one heat pipe can be thought of as a building block.

The condensers of all the heat pipes are positioned along one peripheral edge of the computing module so that a single fluid handler can be used to move cooling fluid over or past the condenser. The printed circuit boards and portions of the heat pipes can also be positioned within a housing to prevent exposure of the electronic components to outside contaminants.

The invention thus provides true scalability in scaling up computing modules of a computer. Advantageously, a standard building block comprising a heat pipe and a printed circuit board populated with MCM's or other integrated circuits can be added to boost the computing power of a system. When a printed circuit card is added, the cooling system is also upgraded without having to produce a new custom configured cooling system. The cooling system also requires no remote mechanism to move the cooling fluid from inside an enclosure to a condenser outside the enclosure. This provides for a simpler and more reliable cooling system. Certain electronic components populating the printed circuit cards also are not shadowed by larger components "upwind" or "upstream" as in previous systems. With this invention, the component is in thermal contact with the evaporative plate of the heat pipe so "upstream" concerns do not have to be considered by designers. In addition, the cooling system is self-regulating so that if more heat must be removed, more surface area is added by adding another "building block".

BRIEF DESCRIPTION OF THE DRAWINGS

FIG. 3 is a perspective view of a single air-cooled heat pipe assembly.

FIG. 4 is a perspective view of a single liquid-cooled heat pipe assembly.

DESCRIPTION OF THE PREFERRED EMBODIMENT

In the following detailed description of the preferred embodiments, reference is made to the accompanying drawings which form a part hereof, and which illustrate specific embodiments for practicing the invention. It is to be understood that other embodiments may be utilized and structural changes may be made without departing from the scope of the present invention.

As used in conjunction with the present invention, "conductive" or "conduction" cooling means that heat energy is transferred from one physical body to another by direct contact. "Convective" or "convection" cooling means that heat energy is transferred from one physical body to a moving air or other fluid current. "Radiant" or "radiation" cooling means that heat energy is transferred from one physical body by radiating or emitting heat based on the emissive characteristics of the body. "Phase change" or "evaporative" cooling means that heat energy is absorbed by a fluid in a liquid phase near its latent heat of vaporization, changing the fluid to a vapor and, further, that the vapor transfers heat energy to an external reservoir when changing back to the liquid. Although heat can be transferred by conduction, convection and radiation alone or in combination from an electrical device to a remote reservoir, the present invention contemplates providing the primary heat transfer mode in the form of phase-change/evaporation heat transfer as is described herein.

Figure 1:
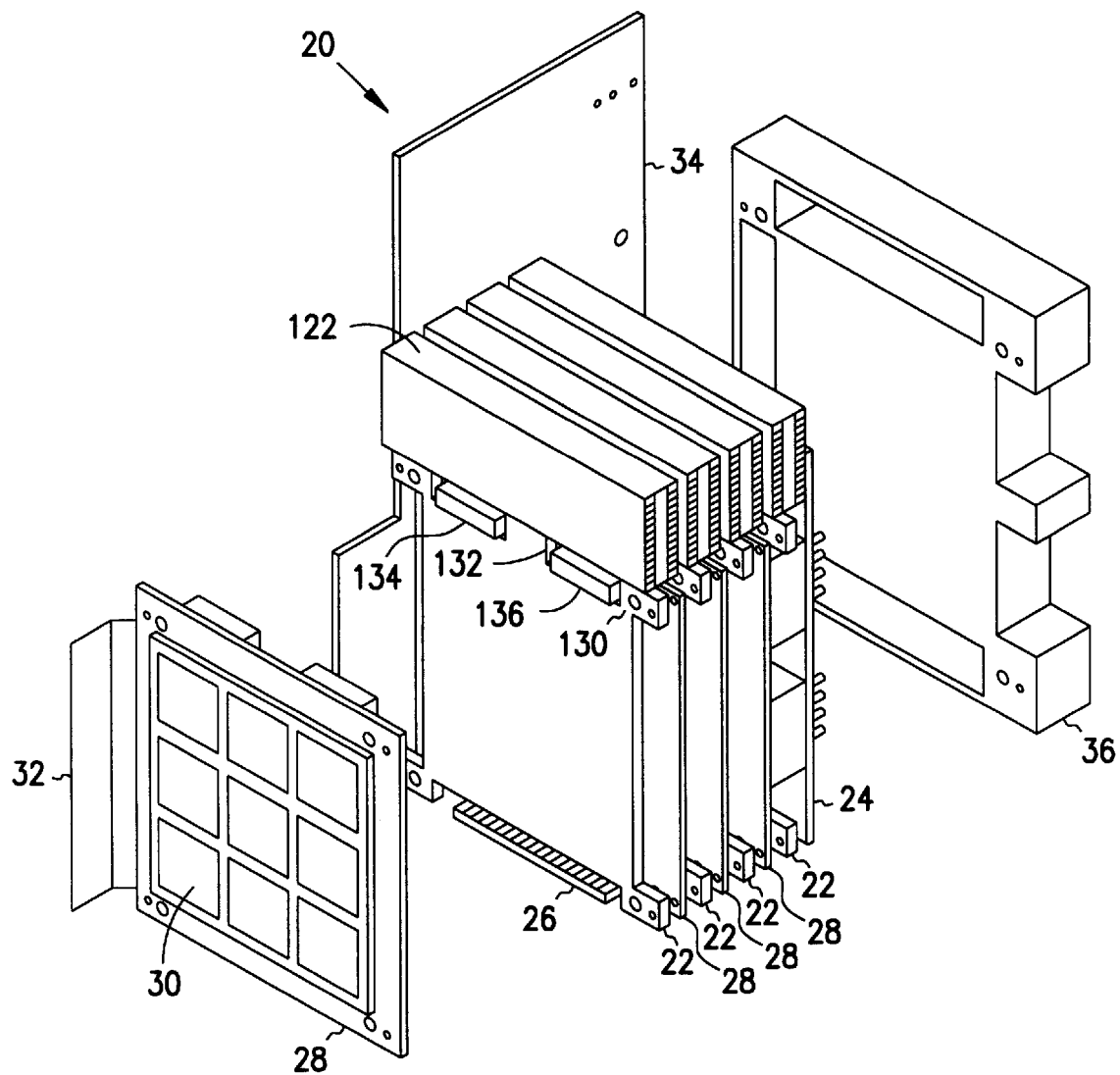
FIG. 1 is a partially exploded perspective view of an air-cooled MCM constructed in accordance with the present invention including a plurality of evaporation/phase change heat pipes.

Referring now to the drawings, FIG. 1 includes a plurality of printed circuit boards 28 populated with single chip modules (SCM) and multi-chip modules (MCM) 30. The single chip modules (SCM) and multi-chip modules (MCM) are also referred to generally as integrated circuits (IC's) 30. FIG. 1 also includes a plurality of heat pipes 22. Each printed circuit board 28 is connected to a heat pipe 22. When constructed in accordance with the preferred embodiment of the present invention shown in FIG. 1, the printed circuit boards 28 alternate with the heat pipes 22 to form a system stack 20. MCM's (and/or) SCM's may be "compliantly" interconnected to the printed circuit board by an interposer. Built in this fashion, the variation in device thickness is accommodated by the interconnect as opposed to accommodation (resulting in decreased capability) by the thermal management system. The system design thus presented permits assembly via simple means. In other words, no soldering of components to boards is required. At the edges of the printed circuit boards 28 are flap-like flexible connectors 32 which are formed from a sheet of polyimide which includes electrical conductors and which are generally known as flex circuit or flex ribbon. The flexible connectors attach and make electrical connection with boards that pass along the edge of the system stack 20. The boards along the edge of the system stack are also printed circuit boards and include a power distribution board 24, and a connector or bus board 26 and a back panel 34. The system stack 20 also includes an end plate 36 onto which the system stack 20 is placed.

Each heat pipe 22 is attached to a condenser 122. Four condensers 122 are shown in FIG. 1. The heat pipe 22 is attached to the condenser 122 via several necked-down regions of the heat pipe 22. One of the necked-down regions 130 can be seen in FIG. 1. The necked-down regions cross less than all the space along the perimeter of the main body of the heat pipe 22. As a result, windows 132 are formed between the main body of the heat pipe 22 and the condenser 122. When the system stack 20 is formed, the windows 132 line up to form another opening through which additional connectors or boards may be placed. Advantageously, the windows 132 allow access to at least a portion of the edge of the printed circuit boards 28 so that these edges can also be utilized for input/output (I/O) connections. FIG. 1 shows a first board 134 and a second board 136 positioned within the windows 132 between the main body of the heat pipe 22 and the condenser 122. It should be noted that other forms of input/output connectors could be placed within the windows 132. In addition, more than one edge of the printed circuit board may utilize a flap-like flexible connector 32.

A primary advantage of the present invention is that it provides a scalable and expandable design which may be adapted to accommodate a wide range of computer technologies. FIG. 1 shows an additional printed circuit board 28 being added to the system stack 20. Additional heat pipes can also be added to a system stack 22. The limiting factor is the length of the boards positioned at the edges of the printed circuit boards 28, such as the backpanel 34, the bus board 26, the first board 134 and the second board 136. These boards must be of sufficient length to make electrical connection with the added printed circuit boards 28. The system stack 22 can be thought of as being formed of a common building block which is comprised of a heat pipe 22 attached to a condenser 122 placed adjacent a printed circuit board 28 populated with IC's 30. Adding to the system stack 20 requires the addition of one or more of these building blocks. Adding building blocks beyond a certain dimension determined by the width or length of the bus board 26, the backpanel 34, the first board 134 and the second board 136 will require replacement of the bus board 26, the backpanel 34, the first board 134 and the second board 136 so that electrical connection can be made to the printed circuit board 28 added as part of the additional building block. It is also contemplated that the mechanism for cooling the multiple condensers 122 may also have to be upgraded when the system stack 20 grows beyond the dimensions determined by the width or length of the bus board 26, the backpanel 34, the first board 134 and the second board 136.

Figure 2:
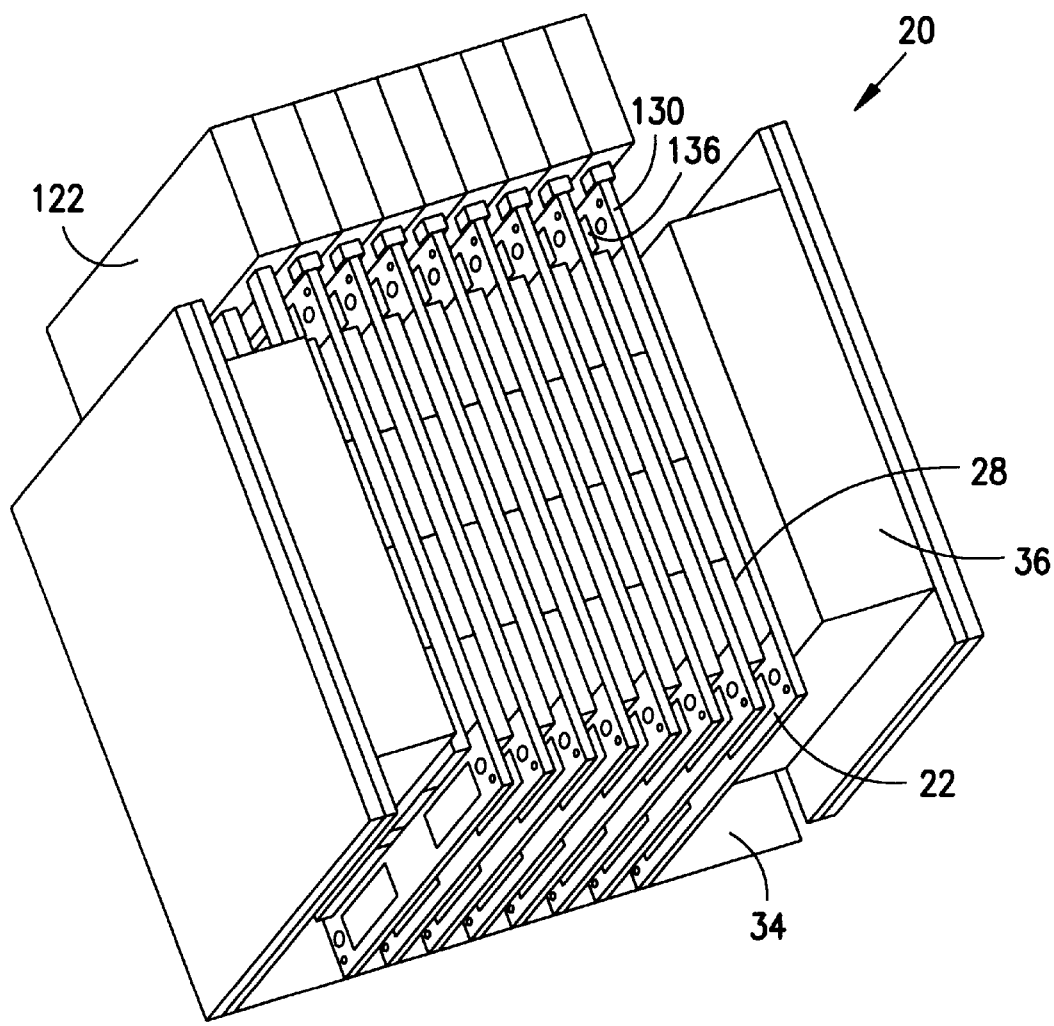
FIG. 2 is a perspective view of the air-cooled MCM of FIG. 1 illustrating one embodiment of an assembled module.

FIG. 2 illustrates an example of an assembled system stack 20 of the common building blocks. With common building blocks the cooling system may be scaled in overall size to accommodate a range of computer applications from a low-end or workstation computer to a high-end or supercomputer. Scalability of the present invention is achieved by utilizing heat pipe technology for thermal management which may be scaled and sized for different computer applications and also designed to accommodate various power and interconnect technologies. The system stack 20 is also designed to be expandable such that a module of any scale may be modified to include fewer or additional boards, heat pipes, and connections as needed for a particular application. As will be evident to those skilled in the art after careful reading of the specification herein, the dimensions of the main bodies of the heat pipes 22 may be sized to accommodate printed circuit boards 28 of any dimensions. The heat pipes 22 may also be constructed from a variety of suitable materials, and stacked to accommodate a variety of different computer constructions and configurations. All of the heat pipes 22 are parallel to one another, and as will be described below, have independent and identical generally planar working fluid-flow characteristics. Once the heat pipe 22, the condenser 122, and the printed circuit boards 28 are sized, a common building block having the same-sized heat pipes 22, condensers 122 and circuit boards 28 can be formed. Such a building block can be used for all of the computers in a particular line of computers from the smallest available computer to the largest supercomputer. The size may also be standardized so that over a number of years and over a number of computer generations, the building blocks remain common. Such commonality makes upgrading a previous generation computer machine much easier.

Each of FIGS. 3 and 4 illustrates a perspective view of a single heat pipe 22 constructed in accordance with one embodiment of the present invention. Each heat pipe 22 includes a main body or evaporator plate 42 which is connected to a condenser 122. Necked-down portions 129, 130, and 131 of the heat pipe 22 connect the evaporator plate 42 to the condenser 122. The three necked-down portions 129, 130, and 131 of the heat plate 42, form windows 132. As mentioned previously, connectors or boards allowing connection to the edge of the printed circuit boards 28 of the system stack 20 can be fit within a series of aligned windows 132. FIG. 4 illustrates an air-cooled version of heat pipe 22 having an air-cooled condenser 40 disposed adjacent an evaporator plate 42 of heat pipe 22. FIG. 3 illustrates a liquid-cooled version of a heat pipe 22 having a liquid-cooled condenser 44 mounted adjacent evaporator plate 42. The construction of evaporator plates 42 may vary as will be described below, but need not differ whether the heat pipe is air-cooled or liquid-cooled.

Figure 5:
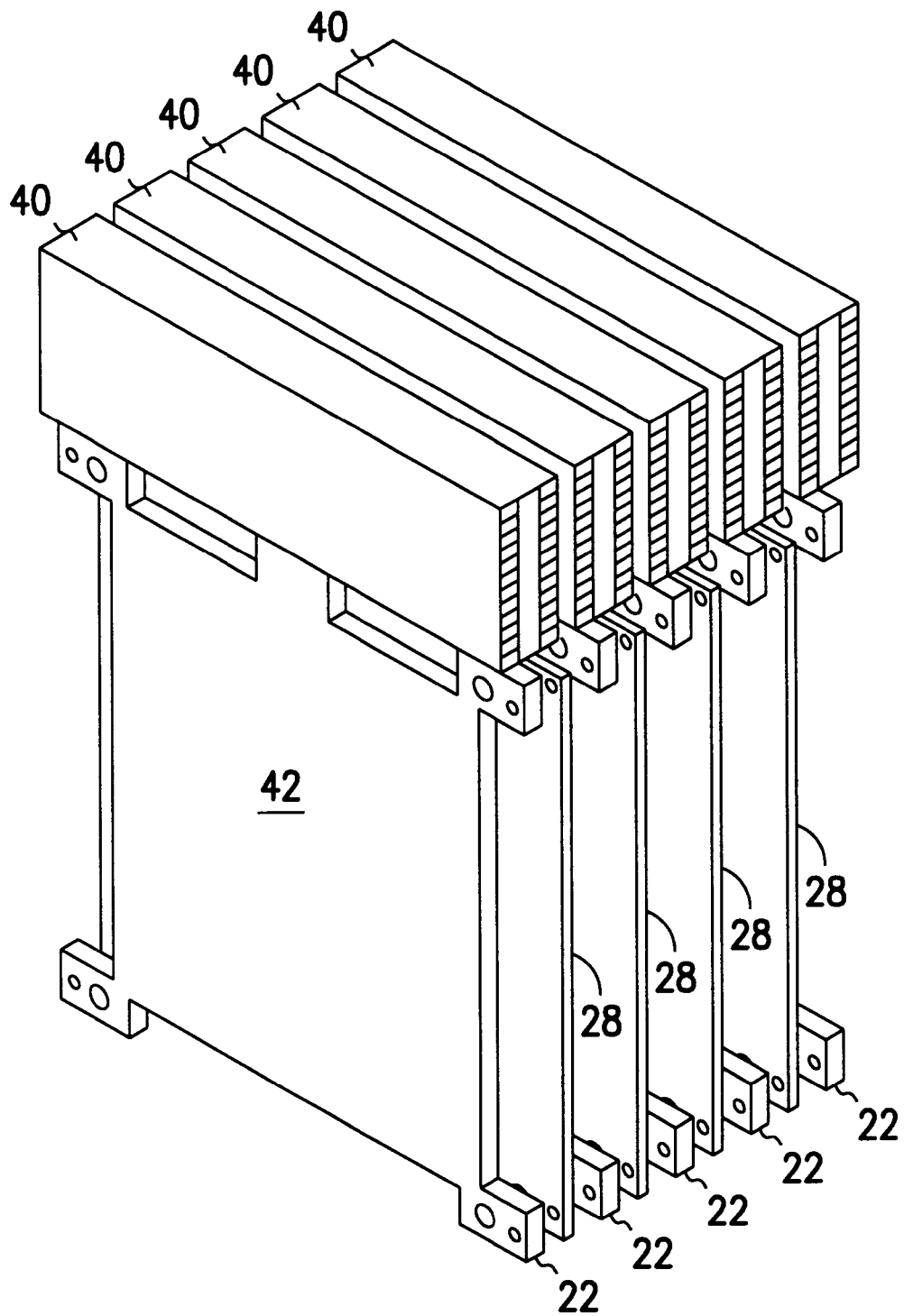
FIG. 5 is a perspective view of a stack of air-cooled heat pipe assemblies.

FIG. 5 illustrates a stack of air-cooled heat pipes 22 simply to illustrate the adaptability of this particular thermal technology to a scalable electronic packaging system. The number of heat pipes 22 joined together in a stack is determined and varied depending on the number of printed circuit boards necessary to complete a computing module for any particular computer such as system stack 20. The size and shape of each evaporator 42 may be varied as well to correspond to a particular printed circuit board design. Additionally, the size, shape, type and other functional characteristics of the condensers 40 may be varied depending on the type and capacity of the cooling system of the computer. Of course an appropriate fan for the air-cooled condenser 40 must be added as part of the design. If a liquid-cooled condenser is used, a pump must be provided to move the refrigerant liquid through the condenser. Thus, MCM 20 is scalable and adaptable to any size of computer into which it is to be installed. In addition, once a size is selected, the same building block can be used throughout a computer line and across several generations of computer lines.

FIG. 5 also shows the condensers 40 positioned on one side or about one peripheral edge of all the printed circuit boards. In a computer system, the printed circuit boards 28 and heat pipes 22 can be positioned within a substantially sealed rack or container. The heat from the printed circuit boards 28 is able to travel from within the rack or container, through the heat pipes 22 to the condensers 40. Heat is removed from the condensers by a pump moving fluid through a liquid-cooled condenser or by air moving over the surface of an air-cooled condenser 40. Advantageously, the IC's on the printed circuit board 28 are not subject to contamination such as when air is blown through a rack in an air-cooled system. Components are also not shadowed by larger IC's or larger components upstream from the source of the airflow such that they are isolated in terms of airflow such that the heat they produce is not dispersed or removed. If heat is not removed from an IC, premature failure of the IC may result.

Figure 6:
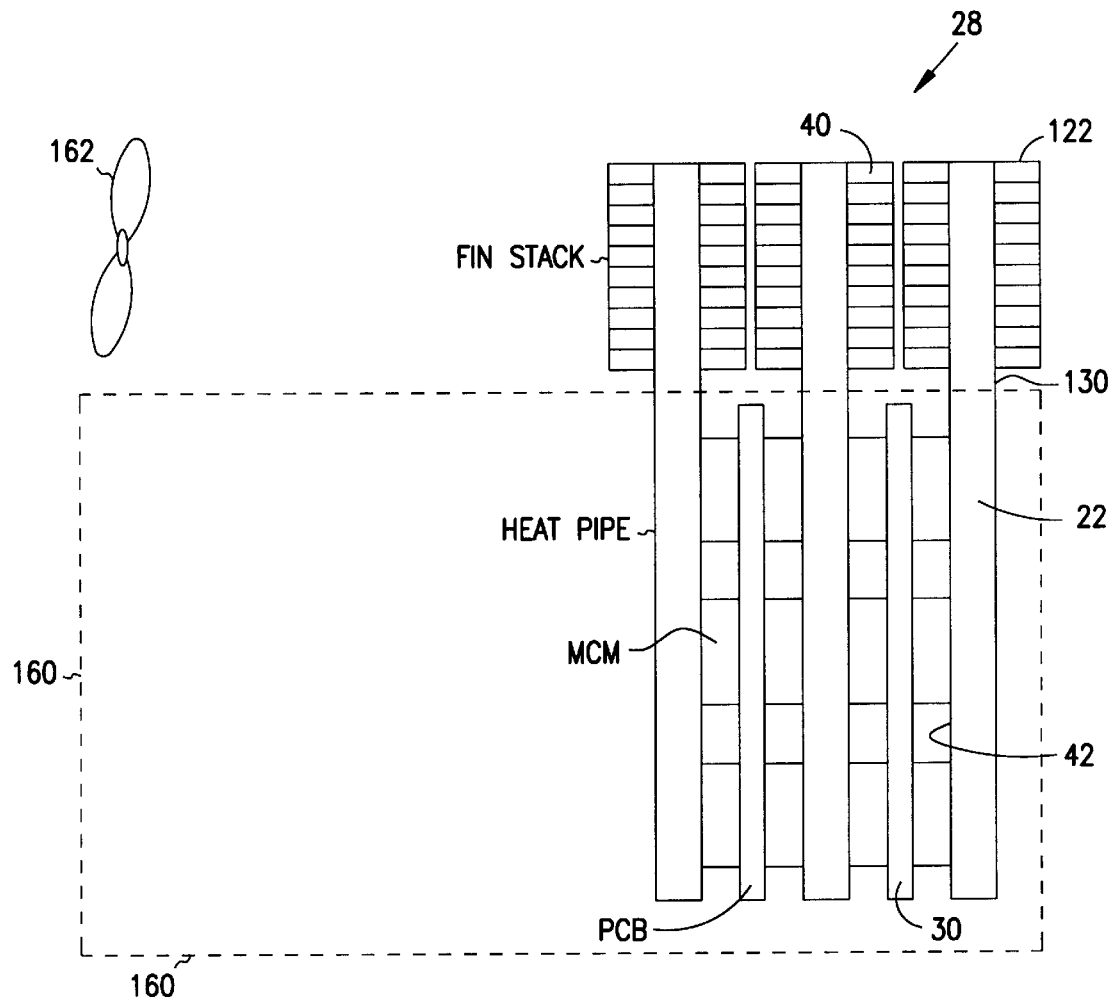
FIG. 6 is a schematic view of a system stack of an assembled electronic package constructed according to the present invention.

FIG. 6 is a schematic representation of a portion of a system stack 20. The system stack 20 includes three heat pipes 22. Attached to each of the heat pipes along one edge is a condenser 122. In this case the condenser 40 is an air-cooled condenser. Each of two printed circuit boards 28 is populated on both sides with MCM type IC's. The heat pipes 22 are placed adjacent the IC's 30 on each side of the printed circuit board 28. It can be seen in this schematic how the height of the IC's impacts how closely packed the heat pipes 22 and the printed circuit boards 28 can be. If the IC's 30 have a large height dimension, the spacing between the heat pipes 22 is increased. The spacing of the heat pipes 22 decreases when the height of the IC's 30 is decreased. Also, shown as a dotted line representation is the rack or container 160 in which the printed circuit boards 28 sit. Advantageously, the IC's 30 and the printed circuit boards 28 can be sealed off from the outside environment when using this cooling system. Thus, the IC's 30 are not subjected to contaminants from the outside environment. A fluid handler 162, such as a fan, is shown which moves air over the condensers 40 to recondense the fluid in the heat pipes 22. The fluid handler 162 would be a pump if a liquid refrigerant and a liquid-type condenser were used. FIG. 6 shows schematically the use of one or more heat pipes 22 to cool one or more printed circuit boards 28 in a computer. Also shown is the cooling of a module which contains a plurality of multi-chip module IC's therein.

The internal construction of a typical heat pipe 22 is not shown but is described below to illustrate how a typical heat pipe functions. The heat pipe 22 essentially comprises three primary components, the case material which includes evaporator 42 and condenser 40, a working fluid held within a number of flow channels in the evaporator 42, and a wicking material disposed within the flow channels for initiating and driving the working fluid flow through capillary action.

Now returning to FIGS. 3 and 4, evaporator 42 includes a pair of relatively large planar exterior surfaces 50 and 52 which define therebetween an evaporator flow chamber. The flow chamber is further comprised of the flow channels which typically extend within evaporator 42 to reach substantially the entire surface area of the evaporator.

Evaporator 42 has a first edge 58 which in the present embodiment is integrally connected to condenser 40 or 44. The working fluid vapor rejects its heat to the condenser by passing from within the evaporator to the first edge and into the condenser, flowing through the condenser, and returning to the evaporator. The working fluid preferably flows along the length of either type of condenser for completely rejecting the heat energy to return the working fluid to the liquid phase prior to passing back into the evaporator.

FIGS. 3 and 4 also shows that each air-cooled condenser 40 includes a condenser flow chamber 70 formed therein. Air flow chamber 70 has an inlet opening 74 at one end and an outlet opening 76 at its opposite end, permitting air to flow through chamber 70 along the entire length of the condenser for maximum cooling efficiency. Liquid cooled condenser 44 may include one or more flow passages 72 along its entire length with each passage having a coolant inlet opening 78 at one end and an outlet opening at its opposite end. Coolant passages 72 again preferably pass along the entire length of condenser 44 for maximum cooling efficiency.

As will be evident to those skilled in the art, the construction of the condenser portion of heat pipe 22 may vary greatly in shape and size as well as in flow arrangement and type of construction without departing from the scope of the present invention. For example, air-cooled condenser 40 may be of a parallel flow type wherein the air flows across the heat exchanger fins in the same direction as the flow of working fluid through the condenser. Air-cooled condenser 40 may also be of a counter-flow type wherein the airflow and working fluid flow in opposite directions. Alternatively, air-cooled condenser 40 may be of a cross-flow heat-exchanger type wherein the airflow and working fluid flow paths are perpendicular to one another.

Similarly, liquid-cooled condenser 44 may also be of a parallel flow, counter-flow, or cross-flow type construction. The liquid-cooled condenser may also be of a plate fin or circular fin type construction and may include coolant-liquid flow tubes which are flat, circular or of some other shape depending on the heat transfer characteristics desired for a particular construction. Heat pipe 22 may be constructed of a particular size or type and may be coupled to heat pipes of the same or different sizes and constructions depending on the cooling characteristics necessary for a particular computer application. The design of heat pipe 22 may be tailored to a particular application but must provide adequate working fluid volume in liquid form at the heat input or adjacent the heat-producing electronic IC's, which may be MCM's or SCM's, thermally coupled to evaporator 42. The heat pipes must also provide adequate flow channels within evaporator 42 for vapor to flow within the evaporator and pass into the condenser. Additionally, the condenser must provide adequate heat transfer from the working fluid vapor to the air or liquid coolant to change the working fluid into the liquid phase.

Material selection for producing the case comprised of evaporator 42 and in the present embodiment condenser 40 or 44 must take a number of factors into account. Several important factors are the thermal conductivity, the compatibility with the selected working fluid, the ease of fabrication, and the cost and complexity parameters defined by the computer into which a particular heat pipe 22 is to be installed. A material such as aluminum having high thermal conductivity and good machinability characteristics is desirable. Now returning to FIG. 6, other materials may also be suitable depending upon the type of working fluid to be used and upon the amount of waste heat which is expected to be generated by a particular printed circuit board and the IC's 30 connected to the printed circuit board 28. If a case material and a working fluid are not compatible, the working fluid may corrode, erode, or otherwise react with the case material causing premature failure of the heat pipe. It is also preferable that a case material which reduces the external contact resistance between the electronic packages and the heat pipe be used.

A wicking material is disposed within evaporator 42 in the flow channels and preferably covers a majority of the evaporator surface area. The wicking material provides an important characteristic function of the heat pipe 22 in that it provides the mechanism for moving fluid through the heat pipe, eliminating the need for an external energy source for moving the working fluid between evaporator 42 and condensers 40. The wicking material moves the fluid via capillary action. The wicking material is advantageous since it eliminates the need to have an external energy source for moving the working fluid from the inside of the enclosure, chamber or rack 160 to the outside of the enclosure 160. This produces a much simpler and more reliable computer system since there is no primary pump or fluid handler for moving the working fluid from inside the enclosure to outside the enclosure 160. An additional feature of the wicking material is that it is self regulating. For example, when the printed circuit board 28 and the IC's 30 mounted thereto are producing a large amount of heat, the wicking material will move the working fluid in greater volume since the working fluid is also driven by heat. When lesser amounts of heat are produced, at a given device site, less vapor is driven off and, accordingly, less liquid is drawn by capillary action to the first site.

Now returning to FIGS. 3 and 4, the primary function of the wick material is to return the condensed working fluid from the condenser flow chamber 70 or flow passages 72 back into the evaporator. The wick material does so through capillary action which is a function of the wick material pore size. The finer the pore, the greater the capillary pumping pressure of the material. Another important function of the wick material is to spread the working fluid evenly throughout the flow channels to be available in adequate volume within evaporator 42 adjacent each heat-producing IC on the printed circuit board.

Low-performance wick material structures include screen and groove wicks whereas higher performance and hence more expensive wick structures include compressed or sintered metal fibers. One consideration in selecting a wick material for heat pipe 22 is that although a small pore size will increase capillary pumping pressure of the material, the small pore structure may provide a high flow resistance, limiting the rate and amount of flow of working fluid liquid and vapor within evaporator flow channels. This problem may be overcome by selecting and using advanced wick material designs, which incorporate composite wick structures having a fine pore section for capillary pumping action and interspersed larger channels for fluid flow therethrough. Such advanced wick designs may also include separate flow channels for working fluid vapor, helping to reduce the effect of viscous vapor shearing on the fluid flow.

The above description is intended to illustrate the invention, and not to limit or restrict the scope of the invention. Many other embodiments will be apparent to those skilled in the art upon reviewing the above description. The scope of the invention should therefore be construed with reference to the appended claims, along with the full scope of equivalents to which such claims may be entitled.

What is claimed is:

1. A computing module for a computer, said module comprising:
   a first heat pipe assembly having a first evaporator plate, the first evaporator plate further comprising a pair of substantially planar exterior surfaces which define therebetween a first evaporator flow chamber, said first flow chamber extending to substantially the entire surface area of the first evaporator plate;
   a first condenser;
   a necked-down region located between the first evaporator flow chamber and the first condenser, such that the first condenser is in fluid communication through the necked-down region with said first evaporator plate flow chamber; and
   a circuit board populated with at least one electronic component, said first evaporator plate of said first heat pipe positioned adjacent a first side of said circuit board such that at least a portion of said at least one electronic component is adjacent said first evaporator plate exterior surface.

2. The computing module of claim 1 wherein the condenser of said first heat pipe is connected to the evaporator plate of said first heat pipe by a plurality of necked-down regions such that at least one window is formed between the condenser and the evaporator plate of the first heat pipe.

3. The computing module of claim 1 wherein the printed circuit board is populated with a plurality of electronic components, said printed circuit board positioned adjacent said evaporator plate such that at least a portion of said plurality of electronic components are adjacent said evaporator plate exterior surface.

4. The computing module of claim 1 wherein the circuit board has two sides, each side populated with a plurality of electronic components, said computing module further comprising a second heat pipe comprising:
   a second evaporator plate, the second evaporator plate further comprising a pair of planar exterior surfaces which define therebetween a second evaporator flow chamber, said second flow chamber extending to substantially the entire surface area of second evaporator plate; and
   a second condenser in fluid communication with said second evaporator plate flow chamber, said second evaporator plate of said second heat pipe positioned adjacent a second side of said circuit board such that at least a portion of said electronic components are positioned adjacent said evaporator plate exterior surface of said second heat pipe.

5. The computing module of claim 4 wherein the first condenser of said first heat pipe is connected to the first evaporator plate of said first heat pipe by a plurality of necked-down regions such that at least one window is formed between the first condenser and the first evaporator plate of the first heat pipe and wherein said second condenser of said second heat pipe is connected to the second evaporator plate of said second heat pipe by a plurality of necked-down regions such that at least one window is formed between the second condenser and the second evaporator plate of the second heat pipe.

6. The computing module of claim 5 wherein the at least one window formed between the condenser and the evaporator plate of the first heat pipe is aligned with the at least one window formed between the condenser and the evaporator plate of the second heat pipe.

7. The computing module of claim 6 further comprising a connector component positioned within the at least one window formed between the condenser and the evaporator plate of the first heat pipe and the at least one window formed between the condenser and the evaporator plate of the second heat pipe, said connector component connecting to the edge of the printed circuit board positioned near said first and second window.

8. The computing module of claim 1 further comprising an enclosure for enclosing a portion of the computing module, wherein said evaporator plate and said printed circuit board are positioned within said enclosure and said condenser is positioned outside said enclosure.

9. The computing module of claim 4 wherein the heat pipe further comprises:
   a working fluid within said evaporator plate flow chamber which may flow to and from said condenser; and
   a wicking material disposed within said evaporator plate flow chamber for assisting flow of said working fluid.

10. The computing module of claim 4 wherein the condensers are all positioned near one edge of the printed circuit boards.

11. The computing module of claim 1 further comprising a fluid handler for moving a cooling fluid through said condenser.

12. The computing module of claim 11 wherein the fluid handler is a fan for moving air through said condenser.

13. The computing module of claim 11 wherein the fluid handler is a pump for moving liquid through said condenser.

14. A computer system comprising:
   a housing;
   a scalable computing module positioned within the housing, said scalable computing system including at least one printed circuit board populated with at least one electronic component, said scalable computing system capable of receiving additional printed circuit boards populated with electronic components, said scalable computing module further comprising a scalable cooling unit, said scalable cooling unit further comprising:
   a first heat pipe assembly having a first evaporator plate, the first evaporator plate further comprising a pair of planar exterior surfaces which define therebetween an evaporator flow chamber, said flow chamber extending to substantially the entire surface area of the first evaporator plate;
   a first condenser;
   a necked-down region located between the first evaporator flow chamber and the first condenser, such that the first condenser is in fluid communication through the necked-down region with said first evaporator plate flow chamber, said evaporator plate of said first heat pipe positioned adjacent a first side of said printed circuit board such that at least a portion of said at least one electronic component is adjacent said evaporator plate exterior surface.

15. The computer system of claim 14 wherein the printed circuit board has two sides populated with a plurality of electronic components, said computing module further comprising a second heat pipe having
   an evaporator plate, the evaporator plate further comprising a pair of planar exterior surfaces which define therebetween an evaporator flow chamber, said flow chamber extending to substantially the entire surface area of evaporator plate; and
   a condenser in fluid communication with said evaporator plate flow chamber, said evaporator plate of said second heat pipe positioned adjacent a second side of said printed circuit board such that at least a portion of said electronic components are positioned adjacent said evaporator plate exterior surface of said second heat pipe.

16. The computer system of claim 15 wherein the condensers of the first heat pipe and the second heat pipe are positioned near a peripheral edge of the printed circuit board.

17. The computer system of claim 15 further comprising a fluid handler for moving a cooling fluid past the condensers of the first heat pipe and the second heat pipe.

18. The computer system of claim 16 wherein the heat pipes have windows therein, said windows positioned near the peripheral edge of the printed circuit board.

19. The computer system of claim 18 further comprising:
   a second printed circuit board having two sides populated with electronic components; and
   a third heat pipe, one side of said second printed circuit board positioned near the evaporator plate exterior surface of one of said first or second heat pipes, said other side positioned near the evaporator plate exterior surface of the third heat pipe.

20. The computer system of claim 14 wherein the first condenser is connected to the first evaporator plate by a plurality of necked-down regions such that at least one window is formed between the first condenser and the first evaporator plate of the first heat pipe.

21. A method of upgrading a computer which includes a scalable computing module which produces waste heat, said scalable computing module including at least one circuit board populated with electronic components and a first and a second heat pipe, each of said first and second heat pipes having an evaporator plate and a condenser disposed adjacent one edge of said evaporator plate, the evaporator plate further comprising a pair of planar exterior surfaces which define therebetween an evaporator flow chamber, said flow chamber extending to substantially the entire surface area of evaporator plate, said first heat pipe positioned on one side of the at least one circuit board and said second heat pipe positioned on the other side of the at least one circuit board, said method comprising the steps of:
   adding a second circuit board assembly carrying a plurality of electronic components to the computing module by positioning said second circuit board adjacent the evaporator plate exterior surface of the first or second heat pipes;
   adding a third heat pipe having evaporator plate, the evaporator plate further comprising a pair of planar exterior surfaces which define therebetween an evaporator flow chamber, said flow chamber extending to substantially the entire surface area of evaporator plate, and having a condenser disposed adjacent one edge of said evaporator plate, to the computer module by positioning the third heat pipe exterior surface adjacent said second circuit board.

22. A computing module for a computer, said module comprising:

a first heat pipe having an evaporator plate and a condenser in fluid communication with said evaporator plate, said evaporator plate having an evaporator surface;

a second heat pipe having an evaporator plate and a condenser in fluid communication with said evaporator plate, said evaporator plate having an evaporator surface;

connector component; and a printed circuit board comprising two sides populated with a plurality of electronic components, said evaporator plate of said first heat pipe positioned adjacent a first side of said printed circuit board such that at least a portion of said electronic components are adjacent said evaporator surface, said evaporator plate of said second heat pipe positioned adjacent a second side of said printed circuit board such that at least a portion of said electronic components are positioned adjacent said evaporator surface of said second heat pipe, the condenser of said first heat pipe is connected to the evaporator plate of said first heat pipe by a plurality of necked-down regions such that at least one window is formed between the condenser and the evaporator plate of the first heat pipe and wherein said condenser of said second heat pipe is connected to the evaporator plate of said second heat pipe by a plurality of necked-down regions such that at least one window is formed between the condenser and the evaporator plate of the second heat pipe, wherein the at least one window formed between the condenser and the evaporator plate of the first heat pipe is aligned with the at least one window formed between the condenser and the evaporator plate of the second heat pipe, said connector component positioned within the at least one window formed between the condenser and the evaporator plate of the first heat pipe and the at least one window formed between the condenser and the evaporator plate of the second heat pipe, connector component connecting to the edge of the printed circuit board positioned near said first and second window.

* * * * *